United States Patent [19]

Iijima et al.

[11] Patent Number: 5,308,462
[45] Date of Patent: May 3, 1994

[54] PROCESS FOR PRODUCING A FERROELECTRIC FILM DEVICE

[75] Inventors: Kenji Iijima, Kyoto; Ryoichi Takayama, Suita; Yoshihiro Tomita, Neyagawa; Ichiro Ueda, Nishinomiya, all of Japan

[73] Assignee: Matsushita Electric Industrial Co., Ltd., Osaka, Japan

[21] Appl. No.: 938,676

[22] Filed: Sep. 1, 1992

Related U.S. Application Data

[60] Division of Ser. No. 854,756, Mar. 20, 1992, abandoned, which is a continuation of Ser. No. 20,738, Mar. 2, 1987, abandoned.

[30] Foreign Application Priority Data

Mar. 4, 1986 [JP] Japan ................... 61-46560

[51] Int. Cl.$^5$ ............................. C23C 14/34
[52] U.S. Cl. ...................... 204/192.15; 204/192.18; 204/192.26
[58] Field of Search .............. 252/62.9; 318/358; 204/192.15, 192.18, 192.26

[56] References Cited

U.S. PATENT DOCUMENTS

| | | | |
|---|---|---|---|
| 3,666,666 | 5/1972 | Haertling | 252/62.9 |
| 3,671,765 | 6/1972 | Hardtl | 310/358 X |
| 3,816,750 | 6/1974 | Liu | 252/62.9 X |
| 3,997,690 | 12/1976 | Chen | 204/192.26 X |
| 4,201,450 | 5/1980 | Trapani | |
| 4,367,426 | 1/1983 | Kumada et al. | 310/358 |
| 4,471,258 | 9/1984 | Kumada | 310/345 |
| 4,533,849 | 8/1985 | Schnell | 310/358 X |
| 4,677,336 | 6/1987 | Kushida et al. | 310/358 X |

FOREIGN PATENT DOCUMENTS

| | | |
|---|---|---|
| 2061447 | 6/1971 | Fed. Rep. of Germany . |
| 1516408 | 7/1978 | United Kingdom . |
| 2072651 | 10/1981 | United Kingdom . |

OTHER PUBLICATIONS

Iijima, et al, "Preparation of c-axis oriented PbTiO$_3$ thin films and their crystallographic, dielectric, and pyroelectric properties," Journal of Applied Physics, vol. 60, No. 1, pp. 361-367, Jul. 1986.

Iijima, et al, "Epitaxial growth and the crystallographic, dielectric, and pyroelectric properties of lanthanum-modified lead titanate thin films," Journal of Applied Physics, vol. 60, No. 8, pp. 2914-2919, Oct. 1986.

Applied Physics, vol. 21, No. 4, Apr. 1989, Heidelberg DE, pp. 339-343, M Okuyama et al.: "Epitaxial growth of ferroelectric PLZT thin films and their optical properties", p. 339, column 2, paragraph 2-p. 340, column 1, paragraph 2; table 2.

Japanese Journal of Applied Physics, Supplements, vol. 24, Suppl. 24-3, 1985, Tokyo, Japan, pp. 13-16; H Adachi et al.: "Preparation and properties of (Pb,La)T103 epitaxial thin films by multi-target sputtering", figures 2, 3; table I.

Memory Processes In A Ferroelectric-Film-Silicon-Single-Crystal Structure, S. V. Tolstousov, V. M. Mukhorto, E. N. Myasnikov, and V. P. dudkevich, Sov. Phys. Tech. Phys. 30(1), Jan., 1985 (1985 American Institute of Physics).

*Primary Examiner*—Nam Nguyen
*Attorney, Agent, or Firm*—Stevens, Davis, Miller & Mosher

[57] ABSTRACT

For applying ferroelectrics to electronic devices, the poling treatment of the ferroelectrics has been necessary in order to uniform directions of spontaneous polarizations, Ps, in each ferroelectric. This treatment brings about (1) low yields of the devices, (2) difficulties in the fabrication of array devices, and (3) difficulties in the formation of ferroelectric films on semiconductor devices. Now it has been found that a self-polarized film in which spontaneous polarizations, Ps, are unidirectional can be formed by sputtering a ferroelectric materials containing lead under such conditions that the orientation of Ps will be controlled without poling treatment and a high-performance ferroelectric device can be obtained in a high yield by using this film, and thus a process for producing such devices has been found.

8 Claims, 5 Drawing Sheets

PROCESS FOR PRODUCING A FERROELECTRIC FILM DEVICE

This application is a divisional of application Ser. No. 07/854,756, filed Mar. 20, 1992 (abandoned), which was a continuation of application Ser. No. 07/020,738, filed Mar. 2, 1987 (abandoned).

TECHNICAL FIELD

The present invention relates to a device comprising a ferroelectric substance, particularly a ferroelectric film. By using devices of this type, the production of high-resolution arrayed ferroelectric devices can be realized. The present inventive devices, fitted for use as, for ample, IR detecting device, piezoelectric devices, and optoelectric devices, can be applied extensively in the field of electronics.

BACKGROUND ART

In the electronics field, ferroelectrics are applied to a variety of devices including IR detecting devices, piezoelectric devices, optical modulators, optical memories, etc. In recent years, ferroelectric devices in film form have been increasing with increasing demands for miniaturized electronic components due to the progress of semiconductor technology.

In the case of ferroelectric devices such as pyroelectric IR detecting devices and piezoelectric devices, from which changes in the spontaneous polarizations, Ps, of ferroelectrics are taken out as output, a largest value of the output can be obtained when the Ps's of each ferroelectric material are unidirectional. However, ferroelectric porcelains used today in IR detecting devices, piezoelectric devices, and the like are polycrystalline materials, in which the crystals are oriented in various directions, and hence the individual spontaneous polarizations, Ps, of each crystal are oriented at random. In each of epitaxial ferroelectric films and oriented ferroelectric films, the polarization axes of the crystals are uniform in direction but electrical spontaneous polarizations, Ps, form 180° domains that are oriented alternately in opposite directions. Therefore, when these materials are used in such electronic devices as mentioned above, the poling treatment of applying a high electric field ($\sim$100 KV/cm) to make each material is necessary in order to uniform the directions of spontaneous polarizations, Ps.

This poling treatment method raises the following problems:

(1) The poling treatment may cause the dielectric breakdown of materials treated, hence lowering the yield.

(2) It is difficult to pole uniformly a great number of fine ferroelectric elements arranged in a high density as in high-resolution array devices.

(3) The poling treatment itself is impossible in certain cases of integrated devices comprising ferroelectric films formed on semiconductor devices.

There are a number of reports on the formation of films of $PbTiO_3$, PLZT, and the like. With respect to these films, however, none of these reports reveal the process for producing a film in which c-axes that are polarization axes are oriented unidirectionally. Moreover, the process for producing a material in which also spontaneous polarizations are oriented unidirectionally is not clarified at all.

DISCLOSURE OF THE INVENTION

Objects of the invention are to provide a ferroelectric film device from which output can be taken out even when the poling treatment of the film has not been conducted and to provide a process for producing such devices in high yields.

BRIEF DESCRIPTION OF THE DRAWINGS

In FIG. 1; 1—Substrate, 2—Lower electrode, 3—Ferroelectric film, 4—Upper electrode, 5—Opening.

BEST MODE FOR CARRYING OUT THE INVENTION

Figure 1:
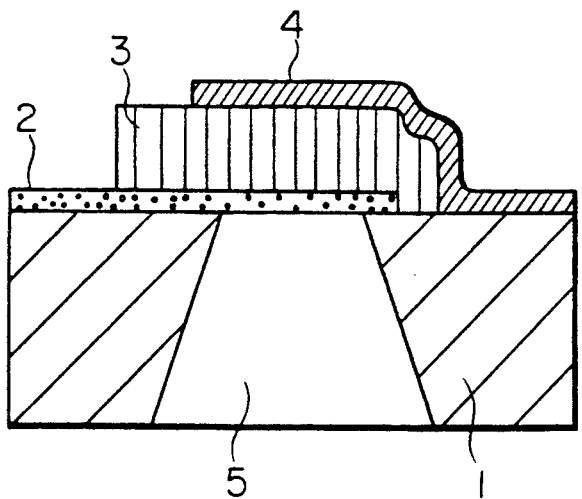
FIG. 1 is a cross-sectional view of a ferroelectric film device prepared in an example of the present invention.

The ferroelectric films sued in the present invention have a composition which is represented by the chemical formula $(Pb_xLa_y)(Ti_zZr_w)O_3$ and lies in a range selected from (a) $0.70 \leq x \leq 1$, $0.9 \leq x+y \leq 1$, $0.95 \leq Z \leq 1$, $w=0$, (b) $x=1$, $y=0$, $0.45 \leq z < 1$, $x+w=1$, and (c) $0.83 \leq x < 1$, $x+y=1$, $0.5 \leq z < 1$, $0.96 \leq z = w \leq 1$.

This film is formed by sputtering and at least 75% of the polarization axes in the film are oriented unidirectionally.

The present invention is based on finding that a self-polarized film having spontaneous polarizations, Ps, oriented in one direction without poling treatment can be formed from a ferroelectric compound containing Pb by controlling the orientation of polarization axes and a high-performance ferroelectric device can be obtained in a high yield by using the film, and; a process for producing such devices.

Referring now to the drawings, embodiments of the invention are described.

FIG. 1 is a cross-sectional view of an example of the ferroelectric film devices which were made according to the invention.

Using a (100)-cleaved and mirror-finished single crystal of MgO as a substrate 1, a 0.4-$\mu$m thick Pt film was formed as a lower electrode 2 thereon by sputtering in an Ar-$O_2$ atmosphere. On electrode 2 a 4-$\mu$m thick ferroelectric film 3 was then grown by the RF magnetron sputtering method using a powder mixture of $$\{(1-Y)Pb_xLa_yTi_zZr_wO_3 + YPbO\} \quad (1)$$

as a sputtering target in an Ar-O$_2$ atmosphere. Then, an upper Ni-Cr electrode 4 was formed on film 3 by vapor deposition and further an opening 5 in substrate 1 was formed by chemical etching thus making up a ferroelectric film device.

Figure 2:
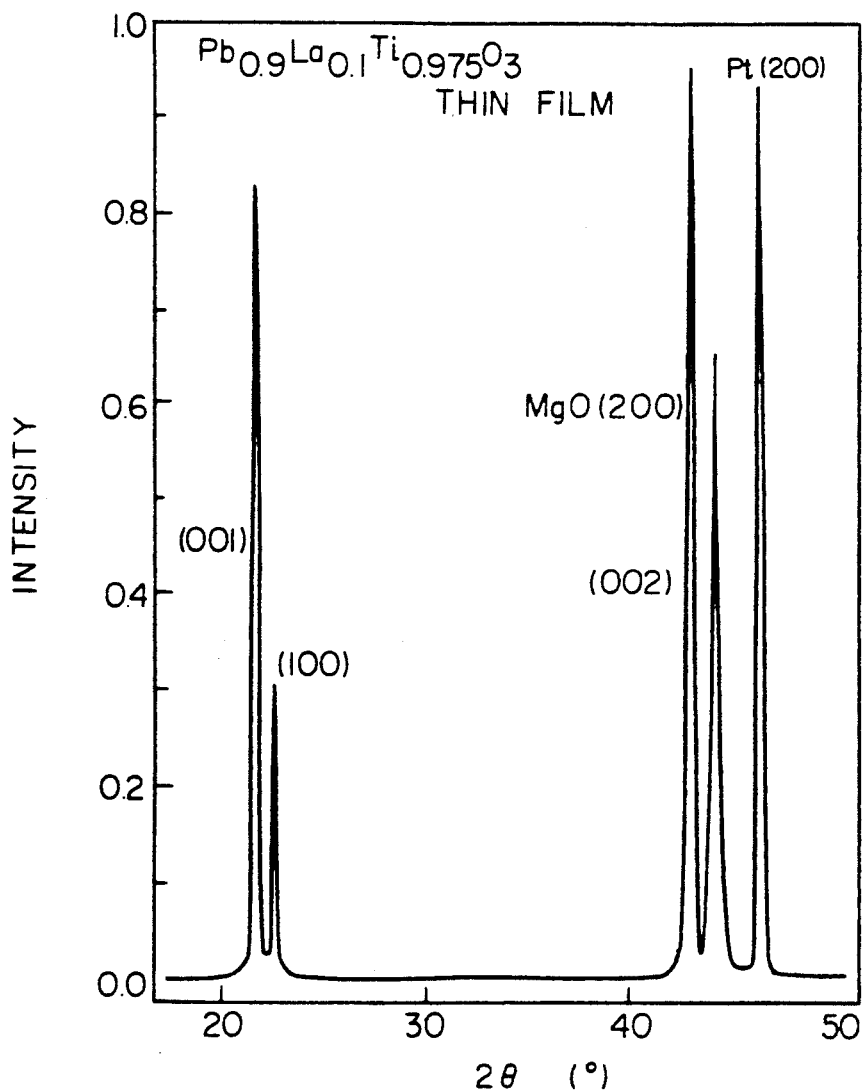
FIG. 2 is a graph showing an X-ray diffraction pattern of a ferroelectric film prepared in an example of the invention.

FIG. 2 shows a typical X-ray diffraction pattern of the ferroelectric film. In the pattern there observed only peaks of (001) and (100) reflections the perovskite structure and the higher-order reflections of these. In addition, the intensity of the (001)-reflection is remarkably stronger than that of the (100)-reflection. Hence this film proves to be of a c-axis orientation type, that is, the c-axes in this film are substantially oriented. The c-axis orientation degree, $\alpha$, is defined by the equation $$\alpha = I(001)/\{I(001)+I(100)\}$$

where I(001) and I(100) are the respective intensities of X-rays reflected from the planes (001) and (100).

Figure 3:
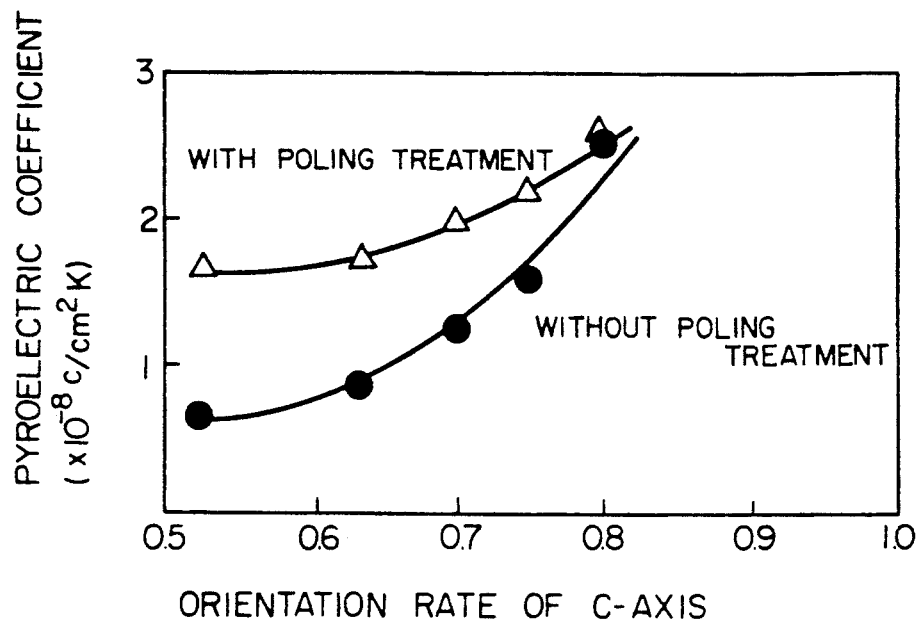
FIG. 3 is a graph showing the dependence of the pyroelectric coefficient of $PbTiO_3$ on the degree of c-axis orientation.

The permittivity and pyroelectric coefficient of the film were measured. FIG. 3 shows the dependence of the pyroelectric coefficient of PbTiO$_3$ on the $\alpha$. As is well know, the pyroelectric coefficient of ferroelectrics increases in proportion to the orientation of spontaneous polarizations, Ps. In FIG. 3, pyroelectric coefficient increases with increases in the degree of orientation. FIG. 3 also shows pyroelectric coefficients of the films subjected to poling treatment (an electric field of 100 KV/cm was applied for 10 minutes at 200° C.). When the orientation degree is low, PbTiO$_3$ not subjected to poling treatment shows also a certain pyroelectric coefficients but there values are low. When the $\alpha$ reaches 75%, the pyroelectric coefficient becomes $1.6 \times 10^{-8}$ c/cm$^2$K. This value is nearly equal to that ($\gamma = 1.8 \times 10^{-8}$ c/cm$^2$K) of a PbTiO$_3$ ceramic subjected to the poling treatment of applying an electric field of 100 KV/cm at 200° C. At an $\alpha$ of 80%, the pyroelectric coefficient is $2.5 \times 10^{-8}$ c/cm$^2$K, which is fairly higher than that of the PbTiO$_3$ ceramic and nearly equal to the value measured after poling treatment. When La was added to PbTiO$_3$ (the product is designated as PLT), similar results were obtained. As stated above, it has been revealed that in the case of PbTiO$_3$ films as well as PLT films, their spontaneous polarizations can be oriented in one direction when that their c-axes are sufficiently oriented during film formation, and especially the c-axis orientation has great effect on these films when $\alpha$ in the films is 75% or higher. As the content of La in PLT is increased, the $\alpha$ decreases gradually. A PLT film of such a high La content that x in composition fromula (1) is less than 0.2 showed in $\alpha$ less than 70%.

Figure 4:
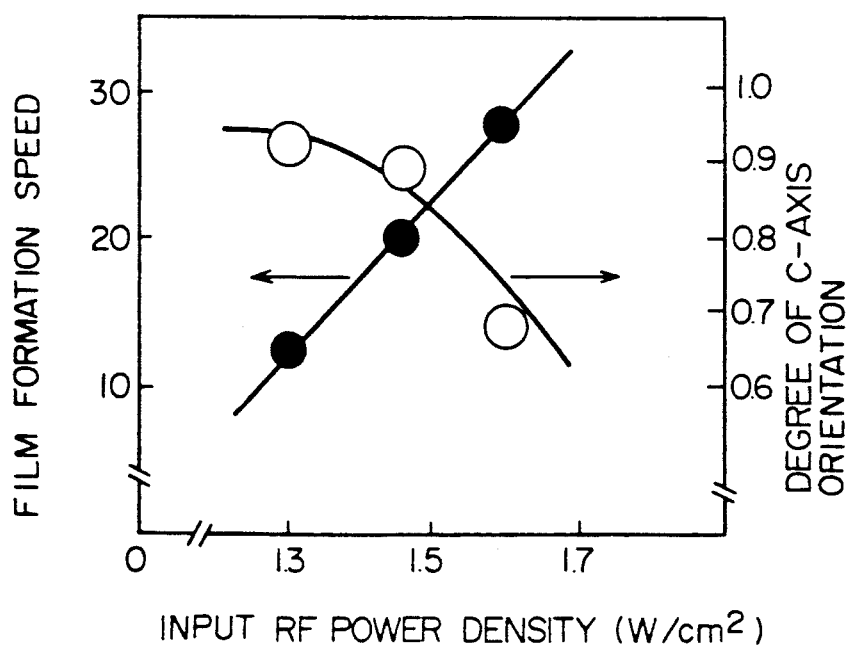
FIG. 4 is a graph showing the relationships among the input RF-power density, the speed of film formation, and the degree of c-axis orientation.
Figure 5:
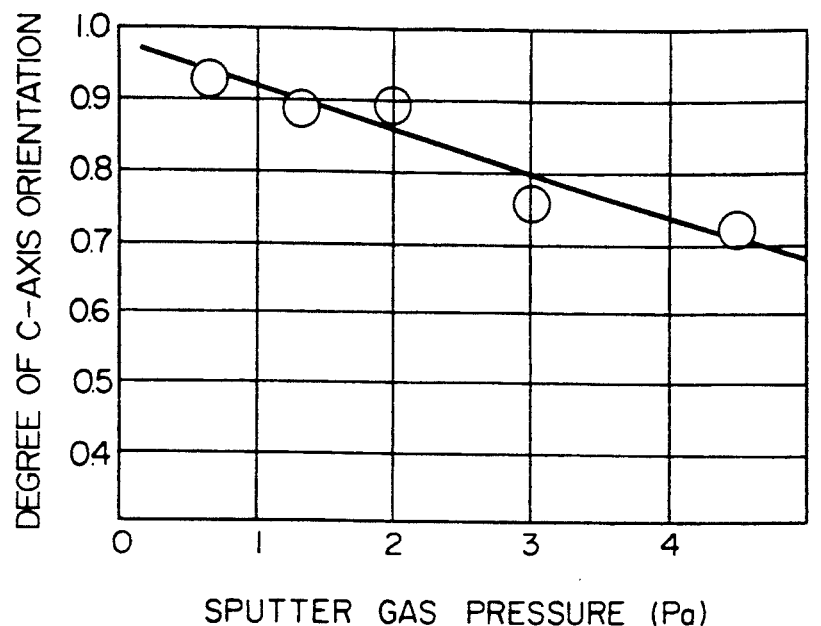
FIG. 5 is a graph showing the dependence of the x-axis orientation degree on the pressure of sputtering atmospheric gas.
Figure 6:
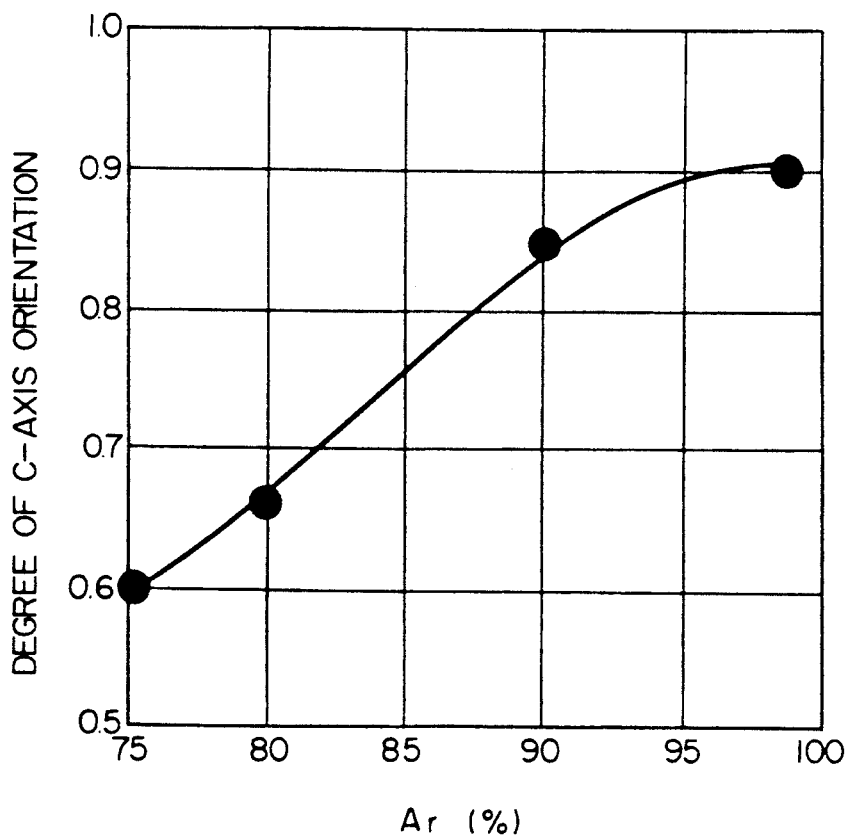
FIG. 6 is a graph showing the dependence of the c-axis orientation degree on the concentration of argon in a sputtering atmospheric gas.
Figure 7:
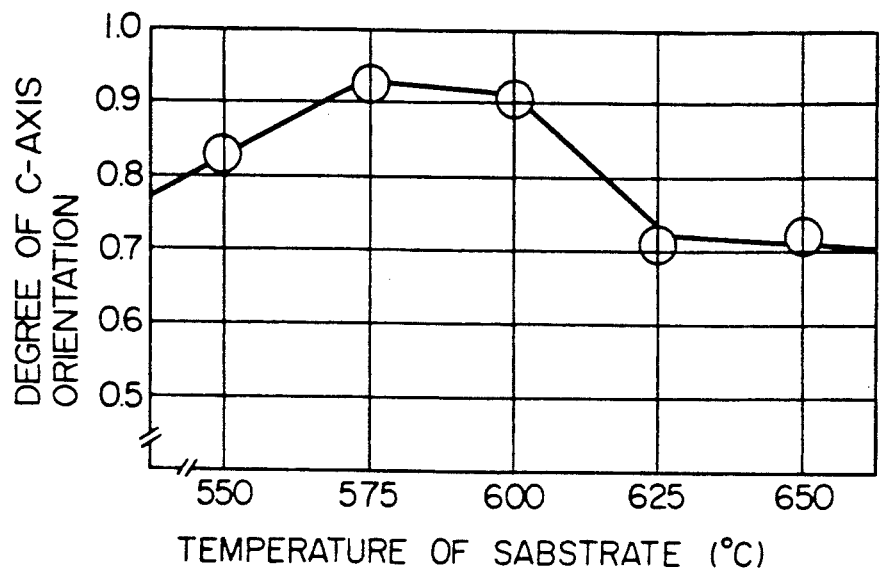
FIG. 7 is a graph showing the dependence of the c-axis orientation degree on the substrate temperature.
Figure 8:
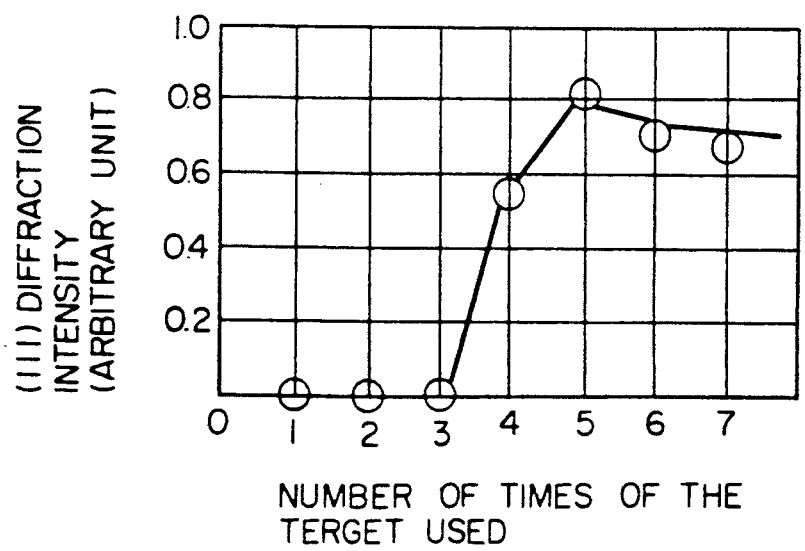
FIG. 8 is a graph showing the dependence of the c-axis orientation degree on the number of target uses repeated.

On the other hand, the degree of c-axis orientation in a ferroelectric film depends on conditions of the sputtering. FIG. 4 shows relations among the $\alpha$, the RF input power, and the speed of film formation. As is evident from FIG. 4, that $\alpha$ decreases greatly with an increase in the speed of film formation. When the speed of film formation exceeds 30 Å/min, the $\alpha$ drops to a means value of about 60%. FIG. 5 shows the dependence of the $\alpha$ on the pressure of sputtering atmospheric gas. Films obtained under sputtering atmospheric pressures of 1 Pa and 2 Pa showed the $\alpha$ of 90% and more. However, when the pressure is raised to 5 Pa or more, the $\alpha$ drops to 60%. FIG. 6 shows the dependence of the $\alpha$ on the proportion of argon in the argon-oxygen sputtering atmospheric gas. In can be seen from FIG. 6 that the $\alpha$ decreases as the proportion of oxygen is increased. When the proportion of oxygen is increased to 30% or more, the orientation degree becomes very low. FIG. 7 shows the dependence of the $\alpha$ in the film on the substrate temperature. The $\alpha$ shows a maximum at a substrate temperature of 550° to 600° C. Too high substrate temperatures induce the formation of PbTi$_3$O$_7$. Substrate temperatures lower than 550° C. results in the contamination of the intended film with crystals having a pyrochlore type of crystal structure. When one sputtering target is used consecutively, (111)-orientation comes to occur instead of c-axis orientation. FIG. 8 shows the dependence of the intensity of (111)-reflection on the number of repeated uses of one target. As is apparent from FIG. 8, consecutive uses of one target 5 to 5 times results in (111)-orientation. Therefore, it is necessary to stir the target powder before each sputtering operation, in order to refresh the surface of the target. The data shown in FIGS. 4 through 8 are results of experiments wherein the target powder was stirred before each sputtering operation. The above shift of orientation direction is caused conceivably by Pb deficiency occurring at the target surface. This is because Pb is sputtered preferentially from the target surface as revealed by the results (shown in Table 1) of forming amorphous films by using targets different in composition without heating substrates and then analyzing Pb/Ti ratios in the resulting films. Accordingly, good results were brought about by the previous incorporation of excess PbO into targets. However, the incorporation of too excess PbO caused the deposition of PbO crystals on the substrate. Good results were obtained when Y of composition formula (1) is in the range of 0.05 to 0.30.

TABLE 1

| Composition of target | Pb/Ti ratio in target | Pb/Ti ratio in film |
| --- | --- | --- |
| PbTiO$_3$ | 1.00 | 1.84 |
| 0.8PbTiO$_3$ + 0.2PbO | 1.23 | 2.60 |
| 0.7PbTiO$_3$ + 0.3PbO | 1.40 | 2.61 |

Figure 9:
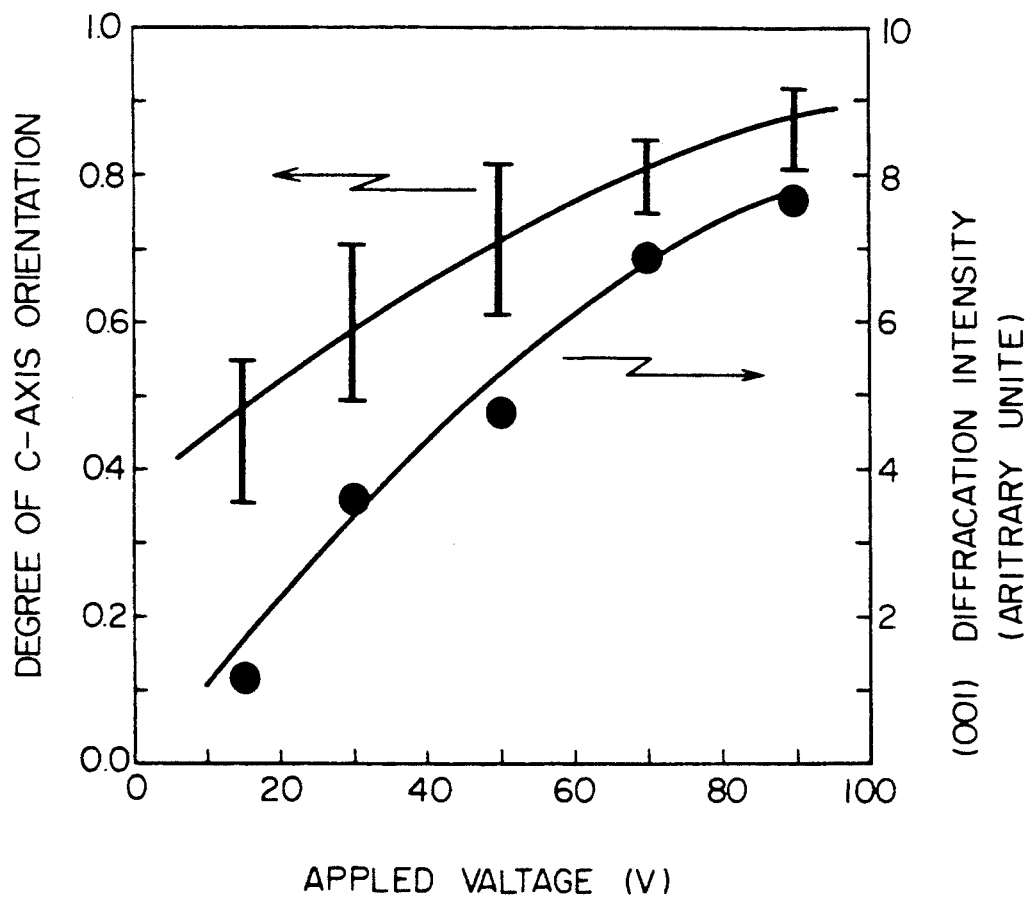
FIG. 9 is a graph showing the dependencies of the c-axis orientation degree and the X-ray diffraction intensity of (001)-reflection on the voltage applied to a substrate.

Further, it has been revealed that a film having a high degree of c-axis orientation can be obtained even at a high speed of film formation by sputtering while maintaining the substrate at a positive potential in relation to the wall of the sputtering chamber. As shown in FIG. 4, for instance, no films other than those having degrees of c-axis orientation as low as 70% and less are obtained under the condition that the substrate is earthed and the speed of film formation is 30 Å/min. Therefore, films were formed each with a voltage being applied to the substrate while earthing the sputtering chamber. The dependence of the $\alpha$ on the applied voltage is shown in FIG. 9, which clarifies that the c-axis orientation degree rises with an increase in the applied voltage. In addition, it can be seen from the increase in the intensity of (001)-diffracted X-rays that the crystallinity is also improved.

It is considered that when the substrate is earthed, Ar ions and the like in the plasma collide with the substrate, thereby disturbing the growth of a film good in crystallinity. Therefore a positive potential is given to the substrate to prevent the ion bombardment, whereby a film having good crystallinity is grown and the degree of c-axis orientation is improved.

Summarizing the foregoing description, suitable sputtering conditions for producing PbTiO$_3$ and PLT films having high degrees of c-axis orientation are as follows: the speed of film formation: up to 30 Å/min, the atmospheric gas pressure: up to 3 Pa, the proportion of argon in the argon-oxygen atmospheric gas: at least 80%, and the substrate temperature: from 550° to 625° C. In order to form constantly films having high degrees of c-axis orientation, it is necessary to incorporate PbO in an excess of 5 to 30 mole % into the target and refresh the target surface before each sputtering operation. It may be noted that when lower electrodes were formed of Au, much the same results were obtained and films superior in c-axis orientation were produced by applying positive voltage to substrates.

Ferroelectric film devices prepared as infrared sensors in these examples were measured for performance characteristic. None of these ferroelectric films were subjected to poling treatment. Results of the measurement are shown in Table 2.

TABLE 2

| Composition of ferroelectric film Pb$_x$La$_y$Ti$_z$Zr$_w$O$_3$ | | | | Detecting power D* | |
|---|---|---|---|---|---|
| x | y | z | w | ($\times 10^8$ cm · Hz$^{\frac{1}{2}}$ · W$^{-1}$) | α |
| 1.0 | 0.0 | 1.0 | 0.0 | 3.0 | 0.88 |
| 0.90 | 0.10 | 0.98 | 0.0 | 2.8 | 0.79 |
| 0.85 | 0.15 | 0.93 | 0.0 | 2.9 | 0.91 |
| 0.75 | 0.25 | 0.94 | 0.0 | 2.9 | 0.84 |
| 0.70 | 0.30 | 0.93 | 0.0 | 2.8 | 0.79 |
| 0.68 | 0.32 | 0.92 | 0.0 | 2.1 | 0.71 |
| 1.0 | 0.0 | 0.95 | 0.05 | 3.1 | 0.93 |
| 1.0 | 0.0 | 0.70 | 0.30 | 3.3 | 0.93 |
| 1.0 | 0.0 | 0.45 | 0.55 | 2.9 | 0.82 |
| 1.0 | 0.0 | 0.40 | 0.60 | 1.9 | 0.63 |
| 0.95 | 0.05 | 0.80 | 0.19 | 2.8 | 0.86 |
| 0.80 | 0.20 | 0.50 | 0.45 | 2.9 | 0.81 |
| PbTiO$_3$ ceramic (without poling treatment) | | | | 0.0 | 0.32 |
| PbTiO$_3$ ceramic (subjected to poling treatment) | | | | 2.0 | 0.46 |

For comparison, Table 2 also shows data on two PbTiO$_3$ ceramics, one being not subjected to poling treatment and the other being subjected to the poling treatment of applying an electric field of 100 KV/cm for 10 minutes at 200° C. As can be seen from Table 2, The PbTiO$_3$ ceramic not subjected to poling treatment gave no output while the sensors prepared according to the present invention without poling treatment exhibited excellent performance.

Thus, large output can be taken from the present inventive device comprising the above described ferroelectric film which has not been subjected to poling treatment. This is true when the present films are produced not only for infrared sensors but also for other optoelectric devices such as piezoelectric devices and optical switches.

The ferroelectric film device of the present invention does not require poling treatment, has superior characteristics, and is easy to produce, hence being very effective for practical use.

INDUSTRIAL APPLICATION

According to the present invention, it is possible to form ferroelectric films of the composition Pb$_x$La$_y$Ti$_z$Zr$_w$O$_3$ without poling treatment and produce film devices in high yield by using these films. This merit is important for ferroelectric film devices to a obtain high resolution array detector and is of great industrial value in the aspects of high reliability and economy.

We claim:

1. A process for producing a ferroelectric film device provided with a ferroelectric thin film in which spontaneous polarizations in said film are oriented in the same direction without any poling treatment being applied to said film, said film having a composition which is represented by the chemical formula (Pb$_x$La$_y$)(Ti$_z$Zr$_w$)O$_3$ and lies in a range selected from
   (a) $0.70 \leq x \leq 1$, $0.9 \leq x+y \leq 1$, $0.95 \leq x \leq 1$, $w = 0$,
   (b) $x = 1$, $y = 0$, $0.45 \leq x < 1$, $x + w = 1$, and
   (c) $0.83 \leq x < 1$, $x + y = 1$, $0.5 \leq z < 1$, $0.96 \leq z + w \leq 1$,
   characterized in that the ferroelectric film is formed on an MgO substrate by sputtering and the speed of film formation is less than 30 Å/min.

2. The process for producing a ferroelectric film device according to claim 1, wherein the pressure of sputtering atmospheric gas is lower than 5 Ps during the formation of the ferroelectric film by sputtering.

3. The process for producing a ferroelectric film device according to claim 1, wherein an argon-oxygen gas mixture containing at least 80% of argon is used as the sputtering atmosphere in the formation of the ferroelectric film by sputtering.

4. The process for producing a ferroelectric film device according to claim 1, wherein the target to sputter has a composition represented by the formula {(1−Y)Pb$_x$La$_y$Ti$_z$Zr$_w$O$_3$+YPbO} where Y is in the range of 0.05 to 0.30 during the formation of the ferroelectric film.

5. The process for producing a ferroelectric film device according to claim 1, wherein the substrate is maintained at a temperature of 550° to 625° C. during the formation of the ferroelectric film by sputtering.

6. The process for producing a ferroelectric film device according to claim 1 wherein the ferroelectric thin film is formed by sputtering from a target and the superficial the superficial composition of the target, before each sputtering operation, is controlled so as to become equal to the original composition of the whole target compounded.

7. The process for producing a ferroelectric film device according to claim 1, wherein the ferroelectric film is formed over the substrate by sputtering while maintaining the substrate to have a positive potential.

8. The process for producing a ferroelectric film device according to claim 1, wherein at least 75% of said spontaneous polarizations are oriented in said same direction without any poling treatment.

* * * * *